United States Patent
Yamada

(10) Patent No.: US 6,438,739 B1
(45) Date of Patent: Aug. 20, 2002

(54) HIGH-LEVEL SYNTHESIS DEVICE HIGH LEVEL SYNTHESIS METHOD AND RECORDING MEDIUM WITH HIGH LEVEL SYNTHESIS PROGRAM

(75) Inventor: Akihisa Yamada, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/212,364

(22) Filed: Dec. 15, 1998

(30) Foreign Application Priority Data

Dec. 22, 1997 (JP) .............................................. 9-353857

(51) Int. Cl.$^7$ .............................................. G06F 17/50
(52) U.S. Cl. ...................................................... 716/18
(58) Field of Search ................................ 716/18, 1–21

(56) References Cited

U.S. PATENT DOCUMENTS 6,053,949 A * 4/2000 Takai ........................... 703/15

OTHER PUBLICATIONS

Pending U.S. Patent Application Ser. No. 08/926,641; filed on Sep. 10, 1997.
David C. Ku, "Hardware C—A Language for Hardware Design Version 2.0"; pp. 3–50.
David W. Knapp; "Behavioral Synthesis: Digital System Design Using the Synopsys Behavioral Compiler", (1996).
Daniel D. Gajski et al.; "High–Level Synthesis: Introduction to Chip and System Design", (1992).

* cited by examiner

Primary Examiner—Matthew Smith
Assistant Examiner—Thuan Do
(74) Attorney, Agent, or Firm—Renner, Otto, Boisselle & Sklar

(57) ABSTRACT

A high-level synthesis device includes: a process extraction section for extracting an available process which performs data communications through a path having no loop from all processes described in an inputted behavioral description; a circuit synthesis section for producing partial circuits realizing the respective available processes and connecting the partial circuits in accordance with the inputted behavioral description so as to synthesize a circuit; and a delay insertion section for inserting a delay circuit in a path connecting partial circuits realizing the available processes so that data communications between the partial circuits through a plurality of paths are synchronized with each other. With the high-level synthesis device, it is possible to simulate synchronous communications between asynchronous processes in accordance with the inputted behavioral description including the description of the synchronous communications, and synthesize a circuit which has a small scale on the whole and operates at a high speed without providing control lines for handshaking.

3 Claims, 7 Drawing Sheets

FIG. 3

PAR

```
LOOP BEGIN                          14
   x = receive(comm1)
   y = receive(comm2)
   z = (x + y) * 3;
   send (comm3, z)
END
```

```
LOOP BEGIN                          15
   a = receive(comm3);
   b = a + 17 ;
   send (comm4, b);
END
```

HIGH-LEVEL SYNTHESIS DEVICE HIGH LEVEL SYNTHESIS METHOD AND RECORDING MEDIUM WITH HIGH LEVEL SYNTHESIS PROGRAM

FIELD OF THE INVENTION

The present invention relates to a high-level synthesis device and a high-level synthesis method, for synthesizing a circuit in accordance with a behavioral description which describes the behavior of the circuit in a high-level language, and a recording medium on which a high-level synthesis program for synthesizing a circuit in such a manner is recorded. More specifically, the present invention relates to a high-level synthesis device and a high-level synthesis method, for synthesizing a circuit in accordance with a behavioral description including a description of synchronous communications, and a recording medium on which a high-level synthesis program for synthesizing a circuit in such a manner is recorded.

BACKGROUND OF THE INVENTION

There have conventionally been some high-level synthesis methods for simulating behavior and synthesizing a circuit, in accordance with a behavioral description which describes a synchronous circuit in a language.

One of the conventional high-level synthesis methods which is employed in a behavioral synthesis system, "Behavioral Compiler" (a product name) manufactured by Synopsys, Inc., is as follows. Namely, the behavioral synthesis system synthesizes a register-transfer-level data of a circuit structure from a behavioral-level data of the circuit structure in accordance with an input of a behavioral description written in VHDL (VHSIC hardware description language) or Verilog-HDL (HDL: hardware description language).

In a synchronous circuit, a clock is generally used as a reference signal for determining the timing of the operation of the whole circuit. In partial circuits (such as an arithmetic unit and a register) which operate simultaneously, processing (individual processing) executed by the respective partial circuits are synchronized with each other by using the clock signal. Generally, in the steps of designing a circuit after the step of designing a register-transfer-level design (logic design), the timing of performing each operation in the circuit (at which time each operation should be executed) is determined with reference to the clock signal. It is thus possible to simulate the behavior using the clock signal as the reference signal.

However, in the step of designing a behavioral-level design (functional design) before the step of designing the register-transfer-level design, the behavior of the circuit is described without reference to the clock signal. Therefore, the timing of executing each operation is not determined until the circuit is synthesized. As a result, when the behavior of the circuit is simulated, asynchronous processes operating on different clocks may perform a data transfer without achieving synchronization with each other, thereby possibly losing the data.

For that reason, it is required to synchronize the asynchronous processes with each other. However, in the above conventional behavioral synthesis system, a command for achieving synchronization between the asynchronous processes cannot be used. Therefore, it is necessary to clearly describe, in the language, a protocol (communication procedure) for communicating data between the asynchronous processes, in order to perform the simulation by synchronizing the asynchronous processes with each other in the behavioral synthesis system.

In this case, the synchronization between the asynchronous processes is clearly described as a behavioral description on a behavioral level. Therefore, with reference to the behavioral description, the simulation in the step of designing the behavioral-level design can be carried out with the asynchronous processes synchronized with each other.

However, a circuit synthesized by the above conventional high-level synthesis method has the following problem. Namely, irrespective of whether synchronous communications between the partial circuits described by the behavioral description can be achieved without handshaking, synchronous communications between the asynchronous processes are realized by a circuit for performing the communications in accordance with the protocol, i.e., by a circuit for data communications between the asynchronous processes with handshaking.

Data communications using handshaking is performed in such a manner that data transmission and reception are carried out after confirming that preparation for transmitting and receiving data is completed. In addition, after finishing the transmission and reception of the data, it is confirmed that the data is properly transmitted and received. Therefore, in the circuit synthesized by the above high-level synthesis method, two control signal lines are always built between the partial circuits using handshaking, in addition to one data line provided for transmission and reception of data. Here, one of the two control signal lines is provided so that the sending side informs the receiving side that the data is ready to be transmitted and received, and the other is provided so that the receiving side informs the sending side that the data has been received. In this way, two control signal lines are always provided for handshaking, even when the synchronous communications between the partial circuits described by the behavioral description is realized without using handshaking. As a result, the circuit scale is enlarged, and the speed of data communications is decreased.

SUMMARY OF THE INVENTION

It is an object of the present invention to provide a high-level synthesis device and a high-level synthesis method, for synthesizing a small-scale high-speed circuit in accordance with a behavioral description which includes a description of synchronous communications and enables a simulation of the synchronous communications between asynchronous processes, and a recording medium on which a high-level synthesis program for synthesizing such a circuit is recorded.

In order to achieve the above object, a high-level synthesis device of the present invention is based on a high-level synthesis device for synthesizing a specific circuit which exhibits behavior described in a behavioral description as data indicating behavior of a circuit aimed to be synthesized, and characterized in including:

a process extraction section for extracting an available process from all processes described in a behavioral description in accordance with the behavioral description including a description of synchronous communications, the available process being a process for performing data communications through a path having no loop;

a circuit synthesis section for producing partial circuits which realize respective available processes and for connecting the partial circuits with each other, in accordance with the inputted behavioral description, so as to synthesize a specific circuit; and a delay insertion section for inserting a delay circuit into a path that connects partial circuits with each other so that data communications between the partial circuits through a plurality of paths are synchronized with each other.

With the above structure, when inputting a behavioral description including a description (command, function, and procedure) for performing synchronous communications between asynchronous processes operating at the same time, the process extraction section of the high-level synthesis device automatically extracts an available process, which can realize the synchronous communications without handshaking, from processes included in the behavioral description. When synthesizing the circuit by connecting the partial circuits that realize the respective processes, a delay circuit is inserted into a path connecting partial circuits with each other so that the data communications between the partial circuits through a plurality of paths are synchronized with each other.

With this arrangement, in the specific circuit synthesized by the high-level synthesis device, although data communications between the available processes are performed without handshaking, partial circuits realizing the respective available processes can carry out the data communications without losing data. Therefore, even when the available processes perform the synchronous communications, a control line for handshaking can be omitted. Consequently, the specific circuit synthesized by the high-level a synthesis device has a smaller scale (area) on the whole and operates at a higher speed, compared with a circuit synthesized by the prior art requiring the control line for handshaking in order to perform the synchronous communications in the simulation on the behavioral level.

Namely, even though a behavioral description enabling the behavior of a specific circuit to be simulated, i.e., a behavioral description including a description of asynchronous processes and synchronous communications between the asynchronous processes is inputted at the stage of designing the behavioral-level design, a high-level synthesis device capable of synthesizing a small-scale high-speed specific circuit can be realized.

When determining a data communication interval of the specific circuit to be synthesized, the high-level synthesis device can employ either of the following methods. Namely, the determination of the data communication interval may be performed in accordance with the interval of the data inputted to the specific circuit or in accordance with the speed (operation speed) at which the partial circuits realizing the specific circuit operate.

When the data communication interval is determined according to the operation speed of the partial circuits, if the operation speed of the specific circuit is required to be improved, it is preferable that the high-level synthesis device has the following arrangement, in addition to the above structure. Namely, it is preferable that the high-level synthesis device further includes: (1) an interval calculation section for calculating a minimum value of a data communication interval which enables data communications with no error between the partial circuits realizing the extracted available processes; and (2) an interval determination section for determining a data communication interval of the data communications between the partial circuits, based on the minimum value, and that the circuit synthesis section synthesizes the specific circuit so that the partial circuits realizing the available processes perform the data communications at the data communication interval determined by the interval determination section.

With this arrangement, it is possible to adjust the data communication interval of the specific circuit to the practically available shortest interval under constraints of the delay time of the data transfer paths. Therefore, the operation speed of the specific circuit can be easily maximized within a realizable range.

If the specific circuit is constructed only by fastest partial circuits, the operation speed of the specific circuit will be maximized within a realizable range. However, high-speed partial circuits are generally high-power-consuming and high-cost. Therefore, if all the partial circuits are formed by the fastest partial circuits, a high-power-consuming and high-cost specific circuit will be synthesized.

On the contrary, the high-level synthesis device including the interval determination section can synthesize the specific circuit capable of operating at the same speed as the specific circuit constructed only by the fastest partial circuits, without using the fastest partial circuits for some of the partial circuits such as partial circuits except for the critical path (a path requiring the longest processing time). As a result, the high-level synthesis device capable of synthesizing a high-speed specific circuit can be supplied without much increasing the power consumed by the specific circuit and the cost of the specific circuit.

By the way, the description of the synchronous communications included in the behavioral description may be, for example, a code group indicating the protocol of the synchronous communications. In this case, however, the speed at which the high-level synthesis device synthesizes the specific circuit may be lowered because of difficulty in extracting the description of the synchronous communications from the behavioral description. In addition, if the extraction is failed, the high-level synthesis device may possibly synthesize an undesired specific circuit.

Therefore, it is preferable that the behavioral description includes, as the description of the synchronous communications, codes (for example, commands, functions, or procedures) which indicate a process including a sending operation of a data and a process including a receiving operation of the data, respectively, and that the process extraction section includes a data transfer graph generation section for recognizing the codes in the inputted behavioral description and generating a data transfer graph composed of nodes which represents respective processes and a directed edge which connects a starting node corresponding to the process including the sending operation with an end node corresponding to the process including the receiving operation.

With this arrangement, the behavioral description is, in advance, provided with specific codes as a description of the synchronous communications, and the process extraction section extracts the synchronous communications between asynchronous processes in accordance with the codes. It is thus possible to quickly and accurately generate the data transfer graph showing the data transfer between the processes. As a result, the high-level synthesis device capable of quickly and accurately synthesizing a specific circuit can be realized. In addition, since the synchronous communications between the asynchronous processes can be described by simply writing the codes, generation of the behavioral description is simplified, compared with the case where the description is generated by writing the protocol.

By the way, in order to achieve the above-mentioned object, a high-level synthesis method of the present invention is based on a high-level synthesis method for synthesizing a specific circuit which exhibits behavior described in a behavioral description as data indicating behavior of a circuit aimed to be synthesized, and characterized in including the steps of:

extracting an available process from all processes described in a behavioral description in accordance with the behavioral description including a description of synchronous communications, the available process being a process for performing data communications through a path having no loop;

synthesizing a specific circuit by producing partial circuits which realize respective available processes and by connecting the partial circuits with each other, in accordance with the inputted behavioral description; and inserting a delay circuit into a path that connects partial circuits with each other so that data communications performed between the partial circuits through a plurality of paths are synchronized with each other. As mentioned above, the description of the synchronous communications included in the behavioral description may be, for example, a code group indicating a protocol of the synchronous communications, or specific codes (commands, functions, procedures, etc.) indicating a process including a sending operation of a data and a process including a receiving operation of the data.

With the above method, although the specific circuit is synthesized in accordance with the behavioral description enabling the simulation of the synchronous communications between asynchronous processes, control lines for handshaking can be omitted between the available processes. As a result, the above method enables the synthesis of a specific circuit which has a small scale on the whole and operates at a high speed, while allowing the simulation at a stage closer to the behavioral level.

In addition to the above-described steps, it is preferable that the high-level synthesis method further includes the steps of: (1) calculating a minimum value of a data communication interval which enables data communications with no error between the partial circuits realizing extracted available processes; and (2) determining a data communication interval of the data communications between the partial circuits, based on the minimum value, and that the step of synthesizing a specific circuit is carried out so that the partial circuits realizing available processes perform the data communications at the determined data communication interval.

With this method, it is possible to adjust the data communication interval of the specific circuit to the practically available shortest interval under constraints of the delay time of the paths through which the data is transferred. Therefore, the operation speed of the specific circuit can be easily maximized within a realizable range.

In order to achieve the above-mentioned object, a recording medium of the present invention is a recording medium storing a high-level synthesis program for synthesizing a specific circuit which exhibits behavior described in a behavioral description as data indicating behavior of a circuit aimed to be synthesized, and characterized in storing the high-level synthesis program including:

extracting an available process from all processes described in a behavioral description in accordance with the behavioral description including a description of synchronous communications, the available process being a process for performing data communications through a path having no loop;

synthesizing a specific circuit by producing partial circuits which realize respective available processes and by connecting the partial circuits with each other, in accordance with the inputted behavioral description; and inserting a delay circuit into a path that connects partial circuits with each other so that data communications performed between the partial circuits through a plurality of paths are synchronized with each other. As mentioned above, the description of the synchronous communications included in the behavioral description is not particularly limited. The description may be, for example, a code group indicating a protocol of the synchronous communications, or specific codes (commands, functions, procedures, etc.) indicating a process including a sending operation of a data and a process including a receiving operation of the data.

When the high-level synthesis program is executed by a computer, the above-described high-level synthesis device is realized. Therefore, although the specific circuit is synthesized in accordance with the behavioral description enabling the simulation of the synchronous communications between asynchronous processes, control lines for handshaking can be omitted between the available processes. As a result, the above method enables the synthesis of a specific circuit which has a small scale on the whole and operates at a high speed, while allowing the simulation at a stage closer to the behavioral level.

Furthermore, it is preferable that the high-level synthesis program recorded on the recording medium further includes: (1) calculating a minimum value of a data communication interval which enables data communications with no error between the partial circuits realizing extracted available processes; (2) determining a data communication interval of the data communications between the partial circuits, based on the minimum value, and (3) synthesizes the specific circuit so that the partial circuits realizing the available processes perform the data communications at the determined data communication interval.

When the high-level synthesis program read out from the recording medium is executed by a computer, the above-described high-level synthesis device is realized. It is thus possible to adjust the data communication interval of the specific circuit to the practically available shortest interval under constraints of the delay time of the data transfer paths. Therefore, a high-level synthesis device enabling the operation speed of the specific circuit to be maximized within a realizable range is realized.

For a fuller understanding of the nature and advantages of the invention, reference should be made to the ensuing detailed description taken in conjunction with the accompanying drawings.

BRIEF DESCRIPTION OF THE DRAWINGS

FIG. 3 is an explanatory view showing an example of a behavioral description to be inputted to the high-level synthesis device.

FIG. 5(*b*) is an example of a data flow graph generated by the interval calculation section of the high-level synthesis device, and this data flow graph is generated in accordance with the second process in the behavioral description.

DESCRIPTION OF THE PREFERRED EMBODIMENTS

Figure 1:
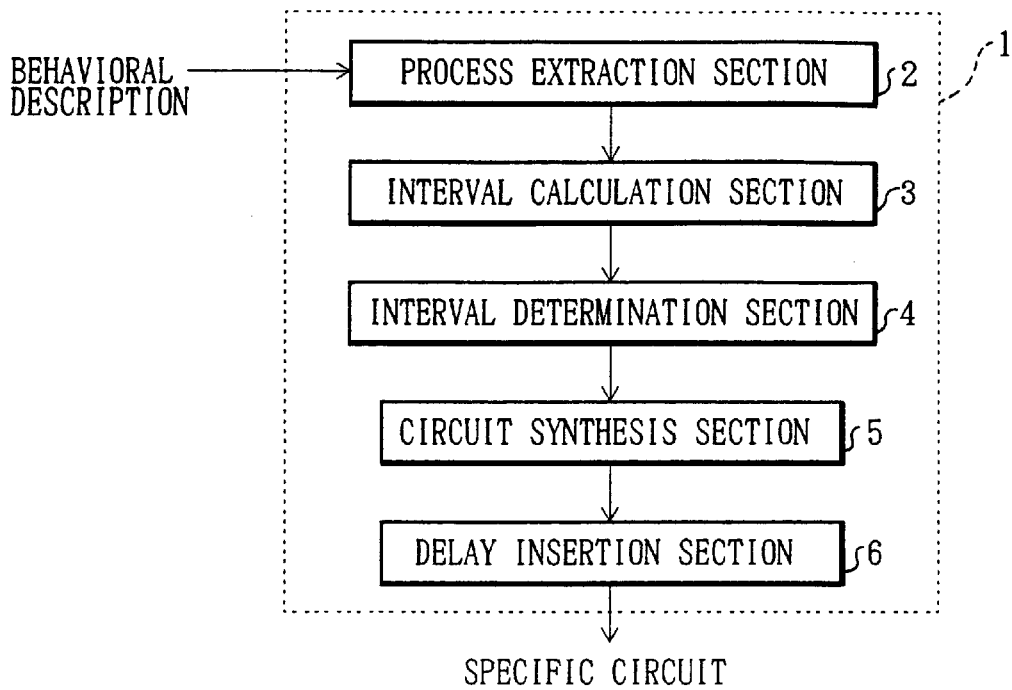
FIG. 1 is a block diagram showing one embodiment of a high-level synthesis device of the present invention.

Referring to FIGS. 1 to 10, the following descriptions will explain one embodiment of the present invention. As shown in FIG. 1, a high-level synthesis device 1 of the present invention includes a process extraction section 2, an interval calculation section 3, an interval determination section 4, a circuit synthesis section 5, and a delay insertion section 6. The process extraction section 2 reads a behavioral description and extracts a set of available processes that can realize synchronous communications without handshaking. The interval calculation section 3 calculates the minimum data communication interval in each available process extracted by the process extraction section 2. The interval determination section 4 determines the interval of data communications between partial circuits which realize the available processes, based on the minimum data communication interval in each available process calculated by the interval calculation section 3. The circuit synthesis section 5 synthesizes a circuit by connecting the partial circuits, which realize the available processes, in accordance with the interval of data communications between partial circuits determined by the interval determination section 4. The delay insertion section 6 inserts a delay between the partial circuits, if necessary, and connects the partial circuits so as to complete the circuit.

A behavioral description is inputted into the high-level synthesis device 1. The behavioral description is a data which describes the behavior of a circuit by using a high-level language. The high-level language can describe synchronous communications between partial circuits (arithmetic units, registers, etc.) by writing commands, functions, or procedures. The high-level language used for the behavioral description is, for example, a parallel C including a subset of C with some additions such as a "par" command for parallel processing, and commands for synchronous communications.

As in the relevant preceding application (U.S. patent application Ser. No. 08/926,641: Tokukaihei 10-116302) of the applicant of the present invention, according to the parallel C used in this embodiment, two commands, "send" and "receive", are provided as commands for achieving the synchronous communications. The two commands define a protocol for transferring data between two asynchronous processes after the asynchronous processes are synchronized with each other. Namely, the data is not transferred until the two processes, i.e., a process (sending process) including a sending operation of a data and a process (receiving process) including a receiving operation of the data, become ready for the transfer. The "send" command instructs that the data is sent from the sending process to the receiving process after achieving synchronization between them, while the "receive" command instructs that the data is received after the synchronization between the sending process and the receiving process is achieved.

Namely, with the simple use of "send" and "receive", the data communications between asynchronous processes can be described from the stage of designing the behavioral-level design, thereby enabling the simulation of the behavior of the circuit without losing data. The generation of the behavioral description and the simulation of the behavior by using the generated behavioral description are carried out repeatedly until no error is found in the behavioral description. The timing for transferring the data is also verified in the simulation at the stage of designing the behavioral-level design, thereby obtaining a behavioral description with less errors.

In accordance with the behavioral description generated in the behavioral-level design, the high-level synthesis device 1 synthesizes a circuit (specific circuit) which exhibits the described behavior, in the following manner. First, the process extraction section 2 of the high-level synthesis device 1 extracts an available process, which enables the synchronous communications without handshaking, in accordance with the inputted behavioral description. More specifically, the process extraction section 2 converts the behavioral description into a data transfer graph, analyzes the data transfer graph, and then extracts available processes, i.e., a set of processes for performing the data transfer without a loop.

Figure 2:
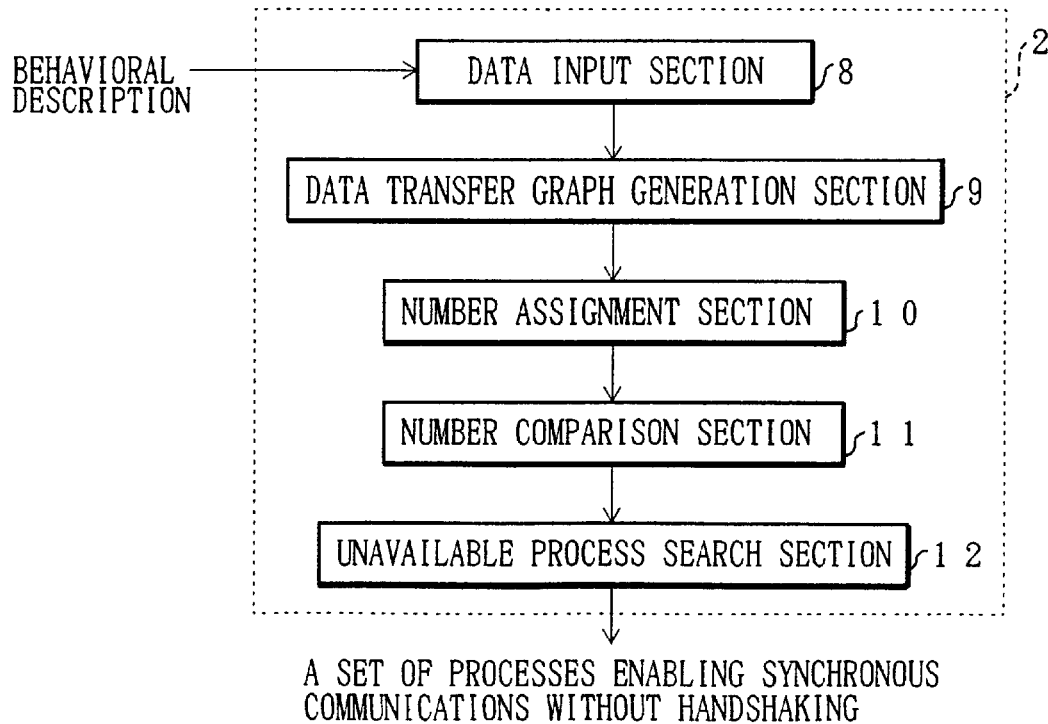
FIG. 2 is a block diagram showing a structure of a process extraction section in the high-level synthesis device.

The process extraction section 2 includes, as shown in FIG. 2, a data input section 8, a data transfer graph generation section 9, a number assignment section 10, a number comparison section 11, and an unavailable process search section 12. The data input section 8 inputs the behavioral description. The data transfer graph generation section 9 generates the data transfer graph showing how the data is transferred between the processes described in the behavioral description. The number assignment section 10 performs a breadth first search and assigns numbers to nodes in the data transfer graph in the ascending order starting with the node in the data input side. The number comparison section 11 compares the numbers of two nodes with each other so as to detect a loop for transferring the data. Here, one of the two nodes corresponds to the starting point of a directed edge (an arrow) in the data transfer graph, and the other corresponds to the end point of the directed edge (hereinafter referred to as the starting node and the end node, respectively). The unavailable process search section 12 judges all the nodes on paths including the loop as unavailable processes, and removes the unavailable processes from the data transfer graph.

How the available processes are extracted by the process extraction section 2 is explained below. First, the data input section 8 of the process extraction section 2 reads a behavioral description. Then, the data transfer graph generation section 9 generates a data transfer graph composed of a node and a directed edge (an arrow), representing each process in the circuit and the direction of the data transfer, respectively. Specifically, the data is transferred from one process to another, i.e., from a starting node to an end node along the direction of an arrow. In addition to the nodes and arrows, the data transfer graph includes a special node representing an input source outside the circuit described by the behavioral description. The input from the input source to a process inside the circuit is also represented by an arrow in the data transfer graph.

The number assignment section 10 performs a breadth first search in the data transfer graph, beginning with the special node representing the input source outside the circuit, and sequentially assigns the numbers, 1, 2, 3, ..., in ascending order to each node. Namely, the numbers indicate the order in which the data is transferred. Here, the breadth first search is a method for searching, along each path, the nearest node from a start point (i.e., a node indicating a process for inputting data to the circuit).

The number comparison section 11 compares the number assigned to the starting node and that assigned to the end node of each arrow in the data transfer graph. When the number assigned to the starting node is larger than that assigned to the end node, the number comparison section 11 decides that a loop is formed between the starting node and the end node of the arrow, and assign a cross mark (x) to each of the starting node and the end node. In this manner, the nodes forming a loop are detected. The assignment of the numbers is carried out in the ascending order in this embodiment. However, other ways of assigning the numbers, such as assigning them in descending order, can be employed for obtaining similar effects, provided that the numbers assigned to the starting node and the end node can be compared with each other when such ways are employed.

The unavailable process search section 12 searches for a node to which a cross mark should be assigned, in the following manner. Namely, regarding each path in the data transfer graph, which includes a node (marked node) with a cross mark assigned thereto, the unavailable process search section 12 judges as to whether the path includes a node with no cross mark assigned thereto, and assigns a cross mark to each node when the path includes such nodes. In this search, the node representing the input source outside the circuit is excluded and not subjected to the assignment of the cross mark. The unavailable process search section 12 carries out the search operation repeatedly until it does not find a node to which a cross mark should be assigned as a result of the search regarding all the paths including marked nodes in the data transfer graph. The nodes which are not marked by the unavailable process search section 12 are extracted by the process extraction section 2 as a set of available processes which enable the synchronous communications without handshaking.

The following description will explain the behavior of the process extraction section 2 by taking as an example the case where the behavioral description shown in FIG. 3 is inputted to the high-level synthesis device 1.

In the behavioral description of FIG. 3, "Par" is a command for operating a process 14 and a process 15 in parallel. The "send" command is a command to send the data by synchronous communications, while the "receive" command is a command to receive the data by the synchronous communications. The process 14 receives data x and data y from external input sources through communications paths "comm1" and "comm2", calculates $z=(x+y)\times 3$, and sends data z to the process 15 through a communications path "comm3". The process 15 stores the value received from the process 14 through "comm3" as a, calculates $b=a+17$, and sends data b to an external device through a communications path "comm4".

Figure 4:
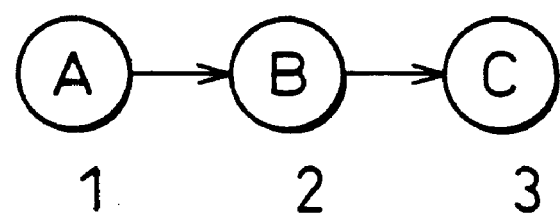
FIG. 4 is an explanatory view showing an example of a data transfer graph created by a data transfer graph generation section of the process extraction section when the behavioral description is inputted.

In the process extraction section 2, the data input section 8 inputs the behavioral description shown in FIG. 3, and then the data transfer graph generation section 9 generates the data transfer graph shown in FIG. 4 in accordance with the behavioral description. In FIG. 4, nodes A to C represent the input source outside the circuit, the process 14, and the process 15, respectively.

Then, the number assignment section 10 of the process extraction section 2 assigns numbers in ascending order to each node starting with the node on the data input side in the data transfer graph. The assigned number is shown under each node in FIG. 4.

Thereafter, the number comparison section 11 makes a comparison between the numbers assigned to a starting node and an end node with regard to each arrow. When a starting node whose number is larger than that of the end node, the number comparison section 11 assigns the cross mark to each of the starting node and the end node. In the data transfer graph shown in FIG. 4, the number assigned to the starting node is smaller than that assigned to the end node with regard to any arrow, no node is marked, thereby indicating that no loop exists in the data transfer graph. Therefore, in the case of the data transfer graph shown in FIG. 4, the process extraction section 2 extracts the processes 14 and 15, represented by the nodes B and C, respectively, as available processes which enable synchronous communications without handshaking.

Figure 7A:
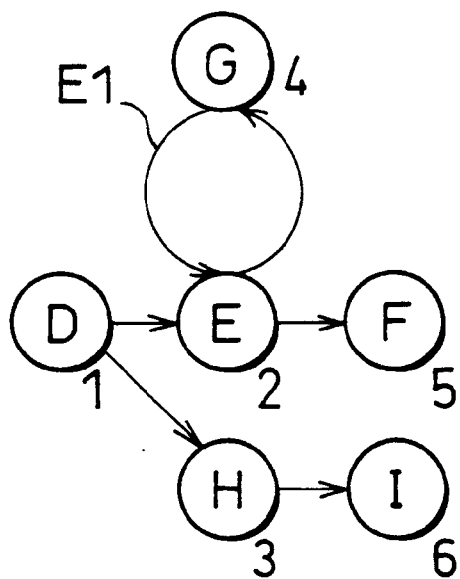
FIG. 7(a) is an explanatory view illustrating processing performed by the process extraction section of the high-level synthesis device when a loop exists in a data transfer path. More specifically, this explanatory view illustrates an example of a data transfer graph and numbers assigned by a number assignment section of the process extraction section.
Figure 7B:
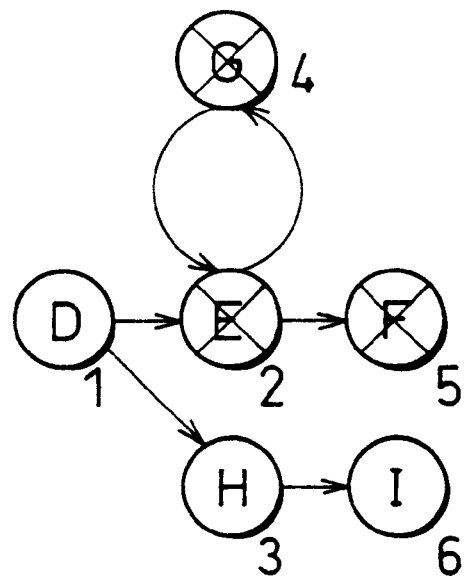
FIG. 7(b) is an explanatory view illustrating processing performed by the process extraction section of the high-level synthesis device when a loop exists in a data transfer path. More specifically, this explanatory view illustrates that some of the processes in the data transfer graph of FIG. 7(a) are judged as unavailable processes by an unavailable process search section of the process extraction section.
Figure 8:
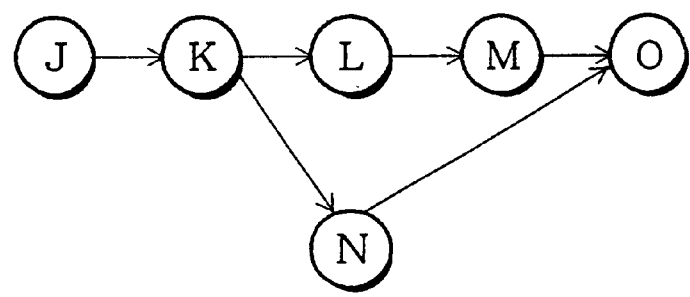
FIG. 8(a) is an explanatory view for illustrating the behavior of a delay insertion section of the high-level synthesis device, and for illustrating an example of the data transfer graph.
FIG. 8(b) is an explanatory view for illustrating the behavior of the delay insertion section of the high-level synthesis device, and for illustrating that a delay circuit is inserted by the delay insertion section into the circuit synthesized in accordance with the data transfer graph of FIG. 8(a).
Figure 8:
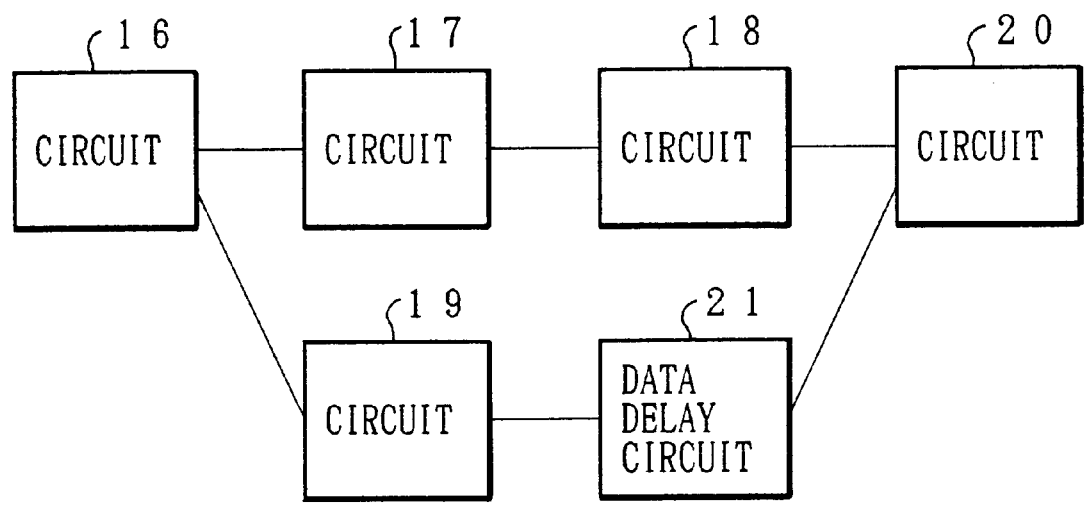

With reference to the data transfer graph shown in FIGS. 7(a) and 7(b), the following description will explain the behavior of the process extraction section 2 when a loop exists in a data transfer between processes.

In this case, after the data transfer graph generation section 9 of the process extraction section 2 generates the data transfer graph shown in FIG. 7(a), the number assignment section 10 performs the assignment of the serial numbers as shown under each node of FIG. 7(a). Next, the number comparison section 11 detects that the number assigned to the starting node is larger than that assigned to the end node with regard to an arrow E1, and that a loop exists between the nodes E and G. Then, the number comparison section 11 assigns a cross mark to each of the starting node E and end node G of arrow E1 shown in FIG. 7(a).

The unavailable process search section 12 assigns a cross mark to any other node on the path where a marked node exists, as shown in FIG. 7(b). Thereafter, the process extraction section 2 extracts a set of elements, which is composed of the processes represented by nodes H and I, as available processes which achieve synchronous communications without handshaking.

The interval calculation section 3 shown in FIG. 1 calculates how many times of clock cycle the minimum data communication interval corresponds to. Here, the clock is a clock used for driving the circuit which realizes each process. The minimum data communication interval is the shortest communication interval of each available process extracted by the process extraction section 2.

The above-mentioned calculation is performed in the following manner. First, a data flow graph is created in accordance with a behavioral description indicating one cycle of operations of each process to be performed repeatedly. Next, a critical path, i.e., a path requiring the longest time for processing is found out from the data flow graph. In this case, the cycle of operations of each process other than the critical path cannot be performed repeatedly in the cycle shorter than the processing time of the critical path. Therefore, the shortest repeat cycle of each process, i.e., the minimum data communication interval of each process is the processing time of the critical path. Since the circuit realizing each process is driven by using the clock, the minimum data communication interval is calculated in units of clock cycle.

Therefore, the number of clocks C representing the minimum data communication interval of each process is calculated in units of clock cycle Q by the following equation $$C = \mathrm{ceil}(P \div Q)$$

where ceil(x) is a function for obtaining an integer not less than x, and P is the processing time of a critical path.

Figure 5A:
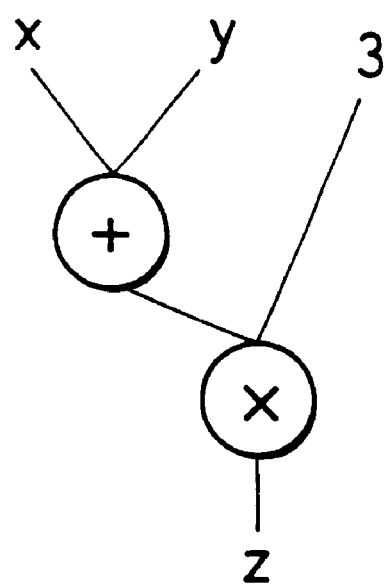
FIG. 5(*a*) is an example of a data flow graph generated by an interval calculation section of the high-level synthesis device, and this data flow graph is generated in accordance with the first process in the behavioral description.
Figure 5B:
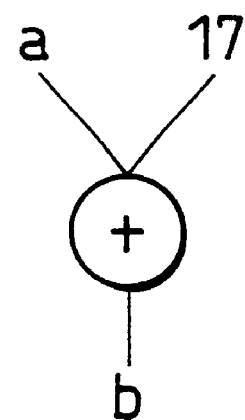

In the case where the behavioral descriptions shown in FIG. 3 are inputted, the interval calculation section 3 generates the data flow graphs of FIGS. 5(a) and 5(b) in accordance with the behavioral descriptions corresponding to the process 14 and 15, respectively.

In FIGS. 5(a) and 5(b), "+" and "×" represent an addition operation and a multiplication operation, respectively. Here, the delay time of the adder having the shortest delay time among the adders available for executing the addition operation is 20 ns. The delay time of the multiplier having the shortest delay time among the multipliers available for executing the multiplication operation is 30 ns. The clock cycle is 40 ns. In FIG. 5(a), each of the path (x→+→×→z) and the path (y→+→×→z) is the critical path. In FIG. 5(b), each of the path (a→+→b) and the path (17→+→b) is the critical path. Therefore, the data communication intervals of the process 14 and 15 are 2 clocks and 1 clock, respectively.

The processing time of each path is calculated by summing the delay times of all arithmetic units executing the operations represented by the nodes on the path, the arithmetic units having the shortest delay time among those available for executing the respective operations. The processing time of each path can also be obtained by adding the delay time of the wiring between the arithmetic units to the sum of the delay times of all the arithmetic units.

The interval determination section 4 selects, as the data communication interval throughout the circuit, the longest data communication interval (number of clocks) from the data communication intervals of all the processes extracted by the process extraction section 2. In the case of the behavioral description shown in FIG. 3, the longest data communication interval is 2 clocks. Thus, the data communication interval throughout the circuit is determined as 2 clocks. The interval determination section 4 may be arranged to determine the data communication interval of the whole circuit in accordance with the interval of the data inputted from the external input source.

The circuit synthesis section 5 synthesizes a circuit in the following manner. Namely, in accordance with the inputted behavioral description, the circuit synthesis section 5 generates partial circuits realizing the respective processes and connects the partial circuits so that the synthesized circuit has the data communication interval determined by the interval determination section 4. Here, there is a limit of the arrangement of the circuit to be synthesized. Namely, the circuit is synthesized so that each cycle of repetitive processes starts by inputting the data and ends by outputting the data.

The circuit is synthesized by, for example, the above-mentioned conventional high-level synthesis method which is generally employed in a high-level synthesis. The high-level synthesis is a category including "Behavioral Compiler".

Figure 10:
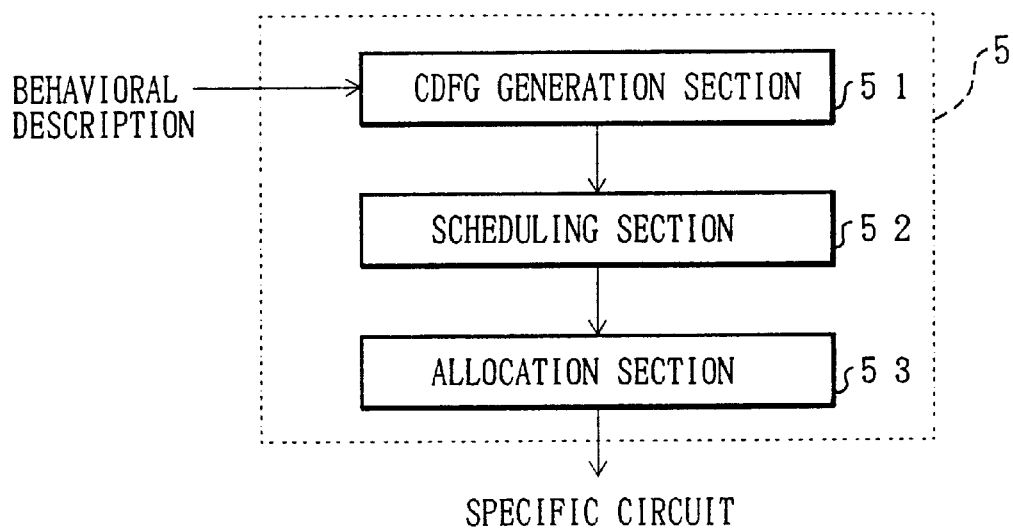
FIG. 10 is a block diagram showing a typical example of a structure of a circuit synthesis section in the high-level synthesis device.

Referring to FIG. 10, the following description will explain how to carry out the high-level synthesis by taking as an example the case where the process introduced in a reference "High-Level Synthesis" (published by Kluwer Academic Publishers) is employed.

The circuit synthesis section 5 includes a CDFG generation section 51, a scheduling section 52, and an allocation section 53. In order to carry out the high-level synthesis, the CDFG generation section 51 converts the inputted behavioral description into a control data flow graph (CDFG) showing a flow of execution control (control flow) and a flow of data (data flow). In the CDFG, a data input, a data output, an operation, and a branch point of control are represented by nodes, and the flow (dependency) of the data between the nodes and the flow (dependency) of the control are represented by edges. Such conversion of the behavioral description into the CDFG in the high-level synthesis is performed for the following reason. Namely, the CDFG is a description which enables a parallel arrangement of a plurality of hardware, while ensuring the behavior described in the behavioral description.

Next, the scheduling section 52 carries out a scheduling process. In this process, the scheduling section 52 determines a relative time required for execution of each data input, data output, operation, and control, corresponding to nodes, in accordance with the dependency shown in the CDFG.

Then, the allocation section 53 carries out an allocation process. In this process, the allocation section 53 selects circuit components (elements) required for constructing the circuit. The circuit components are, for example, an arithmetic unit to be allocated to execute each operation, a selector for selecting the data, and a register for storing the data. In addition, the allocation section 53 synthesizes a control circuit for controlling these circuit components, and then connects the control circuit to other partial circuits to synthesize a circuit. The selection of the circuit components may be performed by the scheduling section 52 together with the scheduling process.

If a circuit is synthesized so as to hold outputted data until the circuit outputs next data again, the above-mentioned limit of the arrangement of the synthesized circuit is eliminated. Namely, it is not necessary to synthesize the circuit so that each cycle of repetitive processes starts by inputting the data and ends by outputting the data.

In the case where a data transfer loop exists between partial circuits, a handshaking circuit cannot be removed from the circuit. Therefore, the partial circuits are created using handshaking, and the partial circuits are connected to each other with a data line and a control line.

When a branch and a re-convergence exist in a path (data transfer path) through which a data is transferred, the delay insertion section 6 inserts a delay circuit between the partial circuits so that it takes the same time for data to reach the re-convergence point through any of the paths, and connects the delay circuit to corresponding input and output terminals of a synthesized partial circuit, thereby synthesizing a final circuit. Then, a register-transfer-level data indicating the structure of the synthesized circuit is outputted. Here, the register-transfer-level data is a data describing the structure of a circuit on the register transfer level in a language such as VHDL.

Figure 6:
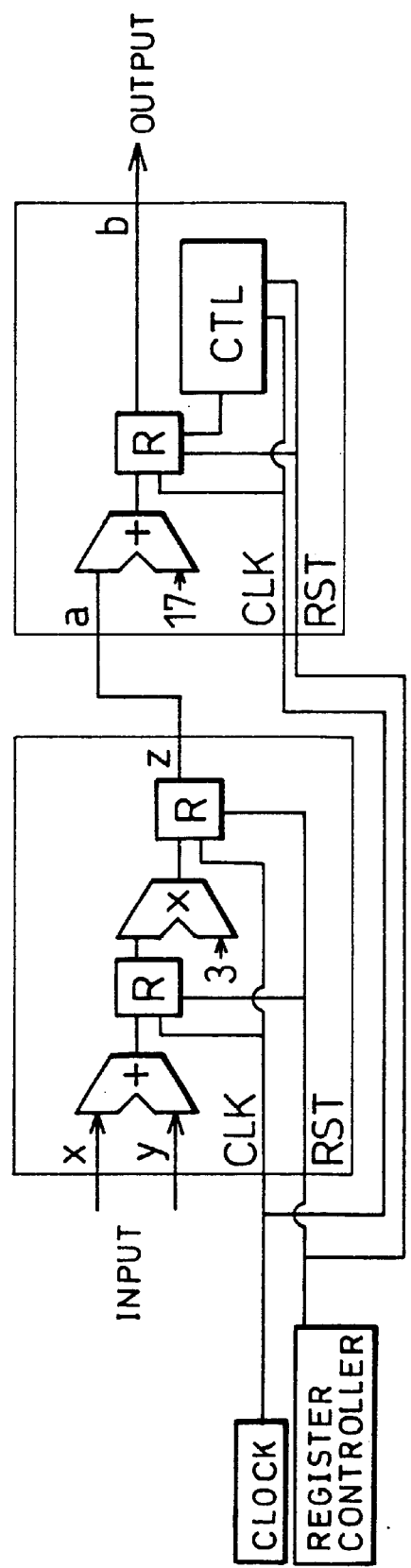
FIG. 6 is a block diagram showing an example of a circuit synthesized by the high-level synthesis device in accordance with the behavioral description.

FIG. 6 shows an example of the circuit synthesized by the circuit synthesis section 5 in accordance with the behavioral descriptions shown in FIG. 3. In this case, since no re-convergence exists in the data transfer path, the insertion of a delay circuit is not required. As a result, the delay insertion section 6 outputs a circuit which is produced by simply connecting an output terminal "z" of a partial circuit realizing the process 14 to an input terminal "a" of a partial circuit realizing the process 15.

Meanwhile, in the case of the data transfer graph shown in FIG. 8(a), since a re-convergence exists in the data transfer path, the delay insertion section 6 inserts a delay circuit. In FIG. 8(a), a node J represents an external input source, and nodes K to O represent processes 1 to 5, respectively.

In this case, there is a path (process 1→2→3→5; node K→L→M→O) and a path (process 1→4→5; node K→N→O). The delay insertion section 6 inserts a data delay circuit 21 so that the data transferred through the respective paths reach the process 5 (node O) at the same time. The data delay circuit 21 can be inserted before or after a circuit 19 realizing the process 4. FIG. 8(b) indicates the case where the data delay circuit 21 is inserted after the circuit 19 realizing the process 4. Provided that each of the processes 1 to 5 transfers the data every four clocks, the data delay circuit 21 is set to introduce a delay corresponding to four clocks. Here, circuits 16 to 20 shown in FIG. 8(b) are partial circuits realizing the processes 1 to 5, respectively.

As described so far, a high-level synthesis device of the present embodiment extracts an available process for performing data communications through a path having no loop from all processes in accordance with a behavioral description enabling the simulation at the stage of producing the behavioral-level design, i.e., a behavioral description including a description of synchronous communications. Then, the high-level synthesis device synthesizes a specific circuit so that the data communications between available processes are synchronized with each other by a delay circuit. Therefore, with the high-level synthesis device, the synchronous communications between the available processes are achieved without handshaking, and a control line required for handshaking between the available processes can be omitted. As a result, the high-level synthesis device can synthesize a smaller-scale high-speed specific circuit even though the behavioral description enabling the simulation of the synchronous communications between asynchronous processes at the stage of designing the behavioral-level design is inputted.

In order to insert the delay circuit, various methods can be employed, provided that the delay circuit is inserted so as to synchronize the data communications between partial circuits through the respective paths with each other. For example, when a plurality of paths for the data communications are re-converged at one process, the determination of a delay time and the insertion of a delay circuit are performed in the following manner. First, the times at which data arrive at the process through the respective paths are compared with each other to determine the latest time of arrival. If the time at which the data arrives at the process through one of the paths is different from the latest time of arrival, the delay time of each delay circuit to be inserted to the path is determined so that the sum of delay times of delay circuits to be inserted is equal to the difference in the times at which the data arrive at the process. In addition, irrespective of the method for inserting delay circuits, the location of the insertion, the number of delay circuits, and the delay time of the respective delay circuits can be arbitrarily determined within the range required for synchronizing the data communications between the partial circuits through the respective paths with each other.

In particular, according to the present embodiment, a source language for the behavioral description is provided with the specific commands ("send" and "receive") for describing synchronous communications between asynchronous processes. Therefore, at the stage of producing the behavioral-level design, the data communications between the asynchronous processes can be described by simply writing the commands, "send" and "receive". As a result, the behavior of the circuit can be simulated from the stage of designing the behavioral-level design without losing the data. Further, by simply extracting the specific commands, the high-level synthesis device can accurately recognize the synchronous communications between the asynchronous processes. It is thus possible to decrease the time required for synthesizing the specific circuit.

Figure 9:
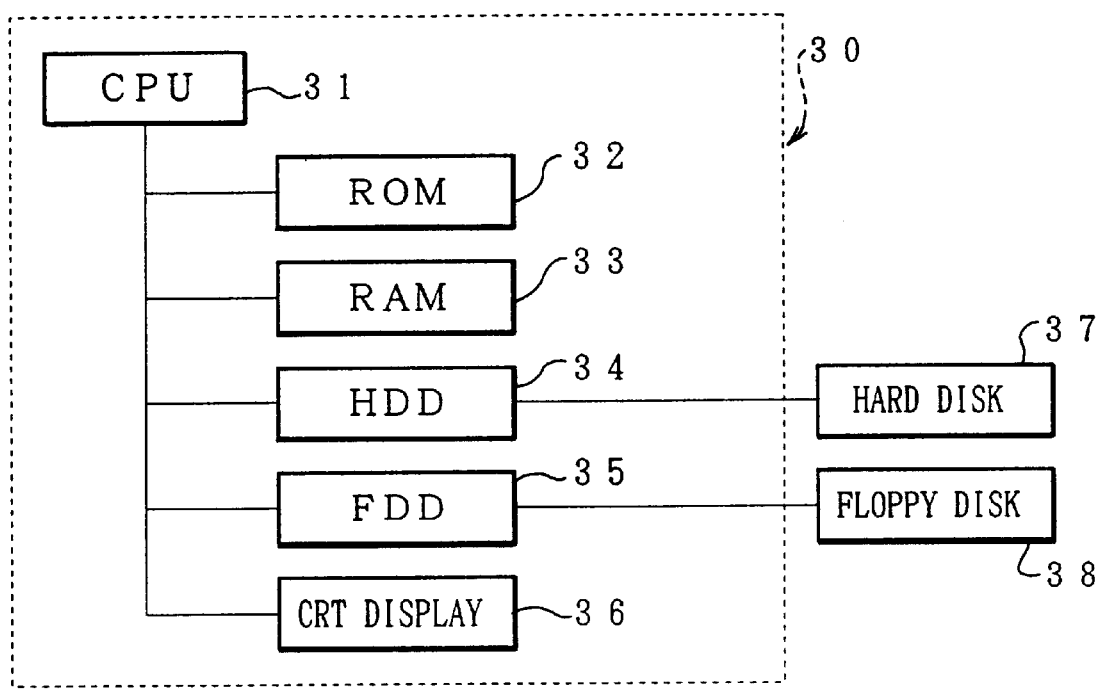
FIG. 9 is a block diagram showing an example of a structure in the case where the high-level synthesis device is realized by a computer.

By the way, the high-level synthesis device of the present invention can be also realized by a computer 30 shown in FIG. 9. The computer 30 incorporates a CPU (central processing unit) 31, a ROM (read only memory) 32, a RAM (random access memory) 33, and a CRT (cathode ray tube) display 36 as an output device. The CPU 31 is connected to an HDD (hard disk drive) 34 for reading and writing data on a hard disk (recording medium) 37, and an FDD (floppy disk drive) 35 for reading and writing data on a floppy disk (recording medium) 38.

The computer 30 performs the function similar to the high-level synthesis device 1, by a function module produced by the CPU 31 and a high-level synthesis program stored in the floppy disk 38, the hard disk 37, or the ROM 32. When the computer 30 is activated, the high-level synthesis program is read into the RAM 33 and executed by the CPU 31. A behavioral description required for executing the high-level synthesis program is inputted through an input device such as a keyboard, connected to the computer 30. When a circuit is synthesized by the high-level synthesis program, the register-transfer-level data of the synthesized circuit is displayed on the CRT display 36.

Instead of the hard disk 37 and the floppy disk 38, other recording media, for example, an optical disk such as a CD-ROM (compact disk read only memory), a magneto-optical disk, an MD (mini disk), and a magnetic tape may be used. In such cases, other devices for reading the respective recording media are used instead of the HDD 34 and the FDD 35. In addition, other display devices, such as a liquid crystal display device, and a printer may be used as an output device in place of the CRT display 36.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A high-level synthesis device for synthesizing a specific circuit which exhibits behavior described in a behavioral description as data indicating behavior of a circuit aimed to be synthesized, comprising:

a process extraction section for extracting an available process from all processes described in the behavioral description in accordance with the behavioral description including a description of synchronous communications between plural asynchronous processes, the available process being a process for performing data communications through a path having no loop;

a circuit synthesis section for producing partial circuits which realize respective available processes and for connecting the partial circuits with each other, in accordance with the inputted behavioral description, so as to synthesize the specific circuit; and a delay insertion section for inserting a delay circuit into a path that connects partial circuits with each other so that data communications between the partial circuits through a plurality of paths are synchronized with each other, wherein the behavioral description includes, as the description of the synchronous communications, codes which indicate a process including a sending operation of a data and a process including a receiving operation of the data, respectively, said process extraction section includes a data transfer graph generation section for recognizing the codes in the inputted behavioral description, and generating a data transfer graph composed of nodes which represent respective processes and a directed edge which connects a starting node corresponding to the process including the sending operation with an end node corresponding to the process including the receiving operation, and said process extraction section further includes:

an order assignment section for assigning order to processes on a path through which data communications are performed, by a breadth first search starting with one of the nodes; and an unavailable process search section for judging as to whether the end node is earlier in order than the starting node with regard to each directed edge described in the behavioral description, deciding that all nodes on a path passing through both of said nodes indicate unavailable processes when the end node is earlier in order than the starting node, and removing all of the nodes on said path.

2. A high-level synthesis method for synthesizing a specific circuit which exhibits behavior described in a behavioral description as data indicating behavior of a circuit aimed to be synthesized, comprising the steps of:

extracting an available process from all processes described in the behavioral description in accordance with the behavioral description including a description of synchronous communications between plural asynchronous processes, the available process being a process for performing data communications through a path having no loop;

synthesizing the specific circuit by producing partial circuits which realize respective available processes and by connecting the partial circuits with each other, in accordance with the inputted behavioral description; and inserting a delay circuit into a path that connects partial circuits with each other so that data communications performed between the partial circuits through a plurality of paths are synchronized with each other, wherein the behavioral description includes, as the description of the synchronous communications, codes which indicate a process including a sending operation of a data and a process including a receiving operation of the data, respectively, the step of extracting an available process includes the step of recognizing the codes in the inputted behavioral description so as to generate a data transfer graph composed of nodes which represents respective processes and a directed edge which connects a starting node corresponding to the process including the sending operation with an end node corresponding to the process including the receiving operation, and the step of extracting an available process further includes the steps of:

assigning order to processes placed on a path through which data communications are performed, by a breadth first search starting with-one of the nodes; and judging as to whether the starting node is earlier in order than the end node with regard to each directed edge described in the behavioral description, deciding that all nodes on a path passing through both of said nodes indicate unavailable processes when the starting node is earlier in order than the end node, and removing all of the nodes on said path.

3. A recording medium storing a high-level synthesis program for synthesizing a specific circuit which exhibits behavior described in a behavioral description as data indicating behavior of a circuit aimed to be synthesized, the high-level synthesis program comprising:

extracting an available process from all processes described in the behavioral description in accordance with the behavioral description including a description of synchronous communications between plural asynchronous processes, the available process being a process for performing data communications through a path having no loop;

synthesizing the specific circuit by producing partial circuits which realize respective available processes and by connecting the partial circuits with each other, in accordance with the inputted behavioral description; and inserting a delay circuit into a path that connects partial circuits with each other so that data communications performed between the partial circuits through a plurality of paths are synchronized with each other, wherein the behavioral description includes, as the description of the synchronous communications, codes which indicate a process including a sending operation of a data and a process including a receiving operation of the data, respectively, the high-level synthesis program recognizes the codes in the inputted behavioral description, and generates a data transfer graph composed of nodes which represents respective processes and a directed edge which connects a starting node corresponding to the process including the sending operation with an end node corresponding to the process including the receiving operation, and the high-level synthesis program assigns order to processes placed on a path through which data communications are performed, by a breadth first search starting with one of the nodes, after generating the data transfer graph; and judging as to whether the end node is earlier in order than the starting node with regard to each directed edge described in the behavioral description, deciding that all nodes on a path passing through both of said nodes indicate unavailable processes when the end node is earlier in order than the starting node, and removing all of the nodes on said path.

* * * * *

UNITED STATES PATENT AND TRADEMARK OFFICE
CERTIFICATE OF CORRECTION

PATENT NO.    : 6,438,739 B1
DATED         : August 20, 2002
INVENTOR(S)   : Akihisa Yamada It is certified that error appears in the above-identified patent and that said Letters Patent is hereby corrected as shown below:

<u>Title page, Item [54] and Column 1, lines 1-4,</u>
The title of the invention should read as follows: -- HIGH-LEVEL SYNTHESIS DEVICE, HIGH-LEVEL SYNTHESIS METHOD, AND RECORDING MEDIUM WITH HIGH-LEVEL SYNTHESIS PROGRAM RECORDED THEREON --.

Signed and Sealed this

Twenty-fourth Day of December, 2002

JAMES E. ROGAN
*Director of the United States Patent and Trademark Office*